(12) United States Patent
Gans et al.

(10) Patent No.: US 6,353,521 B1
(45) Date of Patent: *Mar. 5, 2002

(54) DEVICE AND METHOD FOR PROTECTING AN INTEGRATED CIRCUIT DURING AN ESD EVENT

(75) Inventors: Dean Gans; Ken Marr, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/650,534

(22) Filed: Aug. 30, 2000

Related U.S. Application Data

(63) Continuation of application No. 08/780,422, filed on Jan. 7, 1997, now Pat. No. 6,130,811.

(51) Int. Cl.[7] ................................................. H02H 3/00
(52) U.S. Cl. ....................................................... 361/56
(58) Field of Search ............................. 361/18, 56, 58, 361/91.1, 91.2, 91.3, 91.5, 111, 118, 119; 257/355–358

(56) References Cited

U.S. PATENT DOCUMENTS

| | | | | |
|---|---|---|---|---|
| 5,237,395 A | * | 8/1993 | Lee ............................... | 361/56 |
| 5,276,582 A | * | 1/1994 | Merrill et al. ................ | 361/111 |
| 5,479,039 A | | 12/1995 | Lien ............................. | 257/356 |
| 5,610,790 A | | 3/1997 | Staab ............................ | 361/56 |
| 5,729,419 A | | 3/1998 | Lien ............................. | 361/111 |
| 6,078,487 A | * | 6/2000 | Partovi et al. ................ | 361/56 |

* cited by examiner

*Primary Examiner*—Ronald W. Leja
(74) *Attorney, Agent, or Firm*—Schwegman, Lundberg, Woessner & Kluth, P.A.

(57) ABSTRACT

An integrated circuit having a voltage protection circuit in electrical communication with an input buffer of the integrated circuit and a method for providing voltage protection to the input buffer. In one exemplary embodiment, the voltage protection circuit is an active device, such as a transistor, in electrical communication with an input node of the input buffer. When the active device actuates it provides a current path which limits a potential seen at the input buffer to a value less than an electrostatic discharge (ESD) potential. In one implementation the active device responds to a voltage which develops in response to current flow in an ESD circuit, and in a further implementation it responds to a gate to source potential during an ESD event. In both implementations the active device is actuated during an ESD event and is deactuated during normal operation of the circuit. In a further exemplary embodiment an isolation circuit is interposed between a supply node of the input buffer and the input buffer. When no external power is applied to the supply node the isolation circuit is open, isolating the input buffer from the supply node. The potential of the bond pad is divided between the gate oxide of internal buffer transistors and the isolation circuit. The voltage protection circuit of the invention ensures that the input potential to the input buffer is less than a breakdown voltage of the input buffer.

34 Claims, 8 Drawing Sheets

DEVICE AND METHOD FOR PROTECTING AN INTEGRATED CIRCUIT DURING AN ESD EVENT

CROSS REFERENCE TO RELATED APPLICATIONS

This application is a continuation of U.S. patent application Ser. No. 08/780,422, filed on Jan. 7, 1997, now U.S. Pat. No. 6,130,811 the specification of which is incorporated herein by reference.

FIELD OF THE INVENTION

The invention relates to integrated circuits, and more particularly to electrostatic protection circuits.

BACKGROUND OF THE INVENTION

Integrated circuits are connectable to "the outside world" through bond pads, also referred to as die terminals, die pads, or contact pads. An input buffer, often configured as an invertor, is interposed between the bond pad and active circuitry of the integrated circuit The input buffer is comprised of buffer transistors which should be protected from voltages caused by electrostatic discharge (ESD) during handling and testing of the integrated circuit. Subjecting a device to ESD is referred to as an ESD event. Typically, an ESD circuit, which is well known in the art, is connected at the bond pad. The ESD circuit is a protection device typically comprised of diodes connected back to back at the bond pad. The ESD circuit protects the buffer transistors from high voltages caused by an ESD event The ESD circuit keeps the potential of the bond pad from exceeding a maximum value.

In one application shown in FIG. 1, a diode 1 is interposed between the input to the input buffer 2 and a reference node 3. During handling the integrated circuit is not connected to any electrical potentials, and the potential of the reference node 3 is floating. During an ESD event a potential difference develops across the diode 4. If this potential difference is large enough diode 4 is reversed biased allowing the electrostatic current to shunt the active circuitry and buffer transistors of the integrated circuit However, the diode breakdown voltage may be greater than the breakdown potential of the buffer transistors.

Thus, although the ESD circuit is designed to withstand high current levels, the bond pad potential may be greater than the breakdown voltage of the buffer transistor. This is especially true for a buffer transistor fabricated using current technologies, in which case the thickness of the gate insulator of the buffer transistor has decreased from the thickness obtained using previous fabrication technologies. As the thickness of the gate insulator decreases, the breakdown voltage of the gate insulator decreases. Thus, the breakdown voltage of the buffer transistor is often below the potential established on the bond pad by the ESD circuit.

Thus, a need exists to provide a voltage protection circuit which eliminates breakdown of buffer transistors having low breakdown voltages.

SUMMARY OF THE INVENTION

The invention provides an integrated circuit having a voltage protection circuit and a method for providing voltage protection to the input buffer. The voltage protection circuit of the invention limits a potential seen at the input buffer input node to a value less than a value provided by an electrostatic discharge (ESD) circuit The input buffer is interposed between a bond pad and active circuitry of an integrated circuit.

In a first currently envisioned exemplary embodiment, an active device, such as a transistor, is interposed between an input node to the input buffer and a supply node. In one implementation the active device responds to current generated in the ESD circuit. A potential develops at a control input of the active device as a result of the current in the ESD circuit, and the active device actuates. In a further implementation of the first embodiment the potential of the control input floats during an ESD event and the active device actuates in response to the generation of. a potential on the bond pad. In both implementations the active device is deactuated during normal operation. In both implementations the actuated active device and an input resistor provide a current path and hence a voltage divider circuit to reduce the potential at the input buffer input node to a value well below the breakdown voltage of the input buffer.

In a second currently envisioned exemplary embodiment of the invention an isolation circuit is interposed between a supply node of the input buffer and the input buffer. When no external power is applied to the supply node, the isolation circuit is open isolating the input buffer from the supply node. The potential of the bond pad is divided between the gate oxide of internal buffer transistors and the isolation circuit Thus, the input buffer is protected during the ESD event.

DETAILED DESCRIPTION OF PREFERRED EMBODIMENTS

Figure 1:
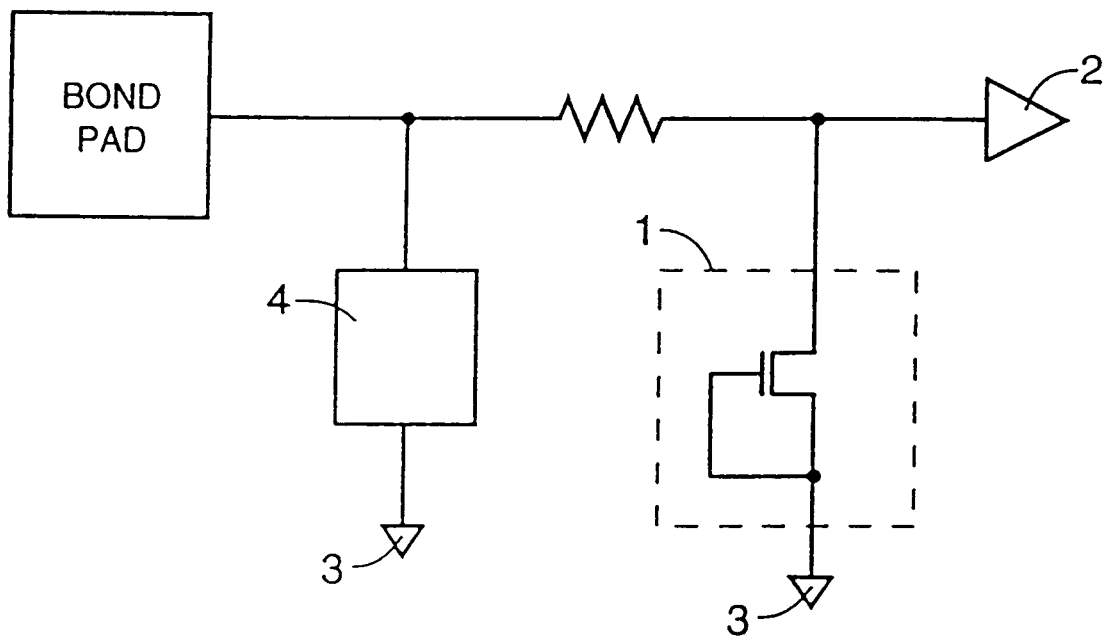
FIG. 1 is a schematic of a circuit of the related art.

An active device is a device, such as a trnsistor, which has a control input whose potential or current actively determines its actuation and deactuation. A passive device is a device, such as a transistor configured as a diode, in which there is essentially no control input When a MOSFET transistor is configured as a diode the gate is connected to the same potential as the source, see diode 1 in FIG. 1.

In a first currently envisioned exemplary embodiment the invention provides an integrated circuit having a voltage protection circuit in electrical communication with an input buffer. The voltage protection circuit of the invention limits a potential seen at an input buffer input node to a value less than a value provided by an electrostatic discharge (ESD) circuit. The input buffer is interposed between a bond pad and internal active circuitry of the integrated circuit which, for example, performs memory finctions during normal circuit operation.

Figure 2:
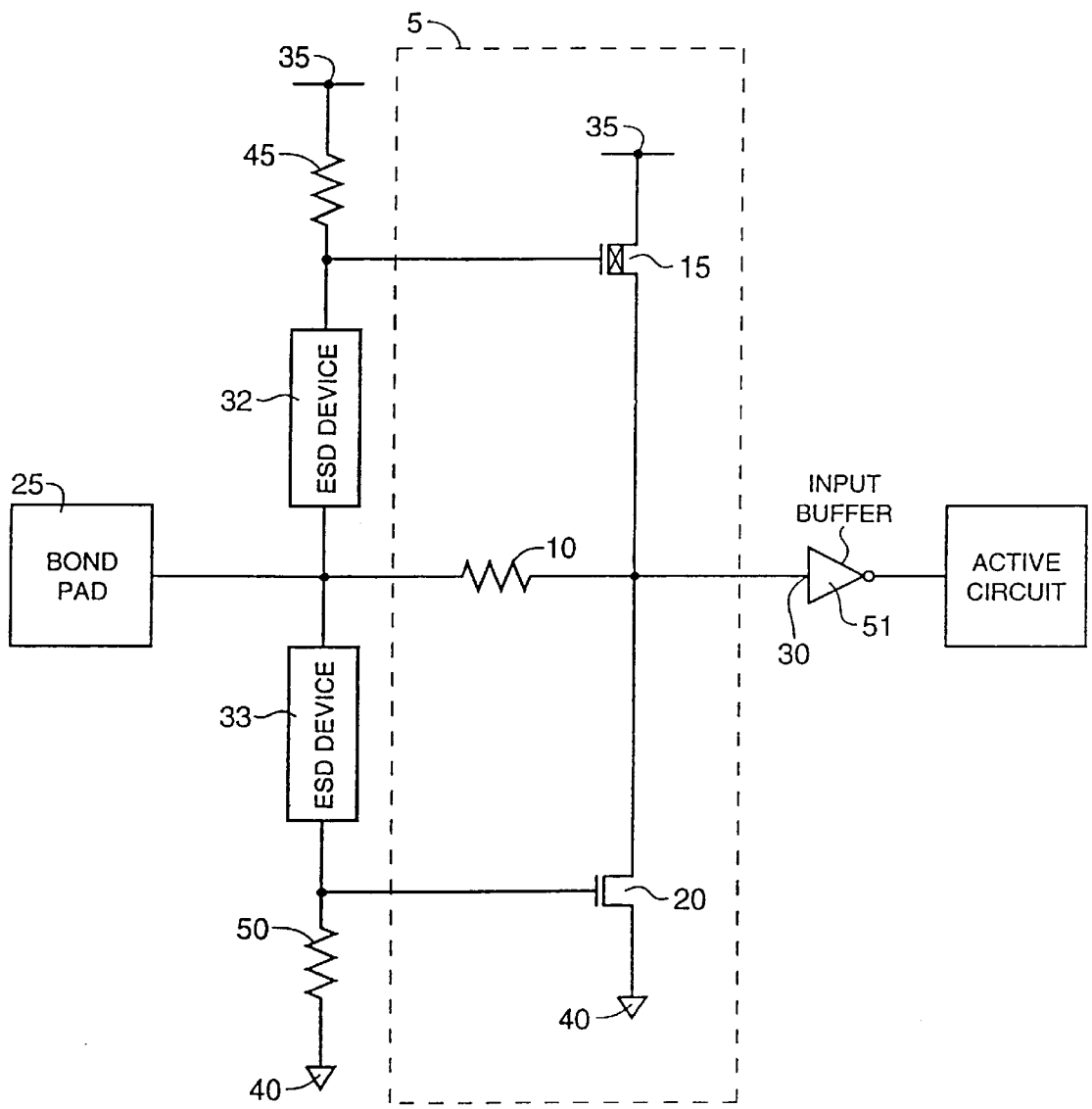
FIG. 2 is a schematic of a first implementation of a first exemplary embodiment of the invention.

One implementation of the first embodiment is an integrated circuit, shown in FIG. 2, having voltage protection circuit 5 which provides a current path through an input resistor 10. Voltage protection circuit 5 comprises pass transistors 15 and 20 and input resistor 10. Pass transistor 15 is a p-channel MOS transistor and is interposed between an input node 30 of input buffer 51 and a supply node 35.

Supply node 35 (and any further nodes designated as supply nodes) is preferably connected, during normal circuit operation, to a supply potential, Vcc, between 2.5 Volts and 5 volts, although the value of the supply potential can fall outside this range without departing from the spirit and scope of the invention Pass transistor 20 is an n-channel MOS transistor and is interposed between the input node 30 and a reference node 40. Reference node 40 (and any further nodes designated as reference nodes) is preferably connected, during normal circuit operation, to a ground reference potential, although other potentials may be used Supply node 35 and reference node 40 remain unconnected from the supply potential and the reference potential, respectively, during handling. The input resistor 10 is interposed between bond pad 25 and the input buffer input node 30. Electrostatic discharge (ESD) circuits 32 and 33 create a bond pad potential at bond pad 25 in response to an ESD event. The ESD circuits 32 and 33 are designed to conduct large currents and maintain the bond pad potential at or less than a maximum potential determined by the circuitry of the ESD circuits 32 and 33. A potential develops across resistors 45 or 50 as a result of current in ESD circuits 32 or 33, respectively. Resistors 45 and 50 are inherently created during the fabrication of the ESD circuits 32 and 33, respectively. However resistors may be fabricated to perform the same fimction as resistor 45 and 50. The gate of transistor 15 is connected between resistor 45 and ESD circuit 32, and the gate of transistor 20 is connected between resistor 50 and ESD circuit 33. Transistor 15 or 20 actuates in response to a potential which develops across either resistor 45 or 50, respectively, during an ESD event Current flows through resistor 10 during the actuation of transistor 15 or 20, thereby reducing the potential seen at node 30 to a value less than the bond pad potential. Thus, the potential at input node 30 is decreased from a value of the bond pad potential to a value below a potential which could cause the input buffer 51 to fail.

During normal operation no current flows through the ESD devices 32 and 33, and the potentials on the gates of pass transistors 15 and 20 remain at the same potential of the nodes 35 and 40, respectively. Thus, transistors 15 and 20 are deactuated during normal circuit operation.

Figure 3A:
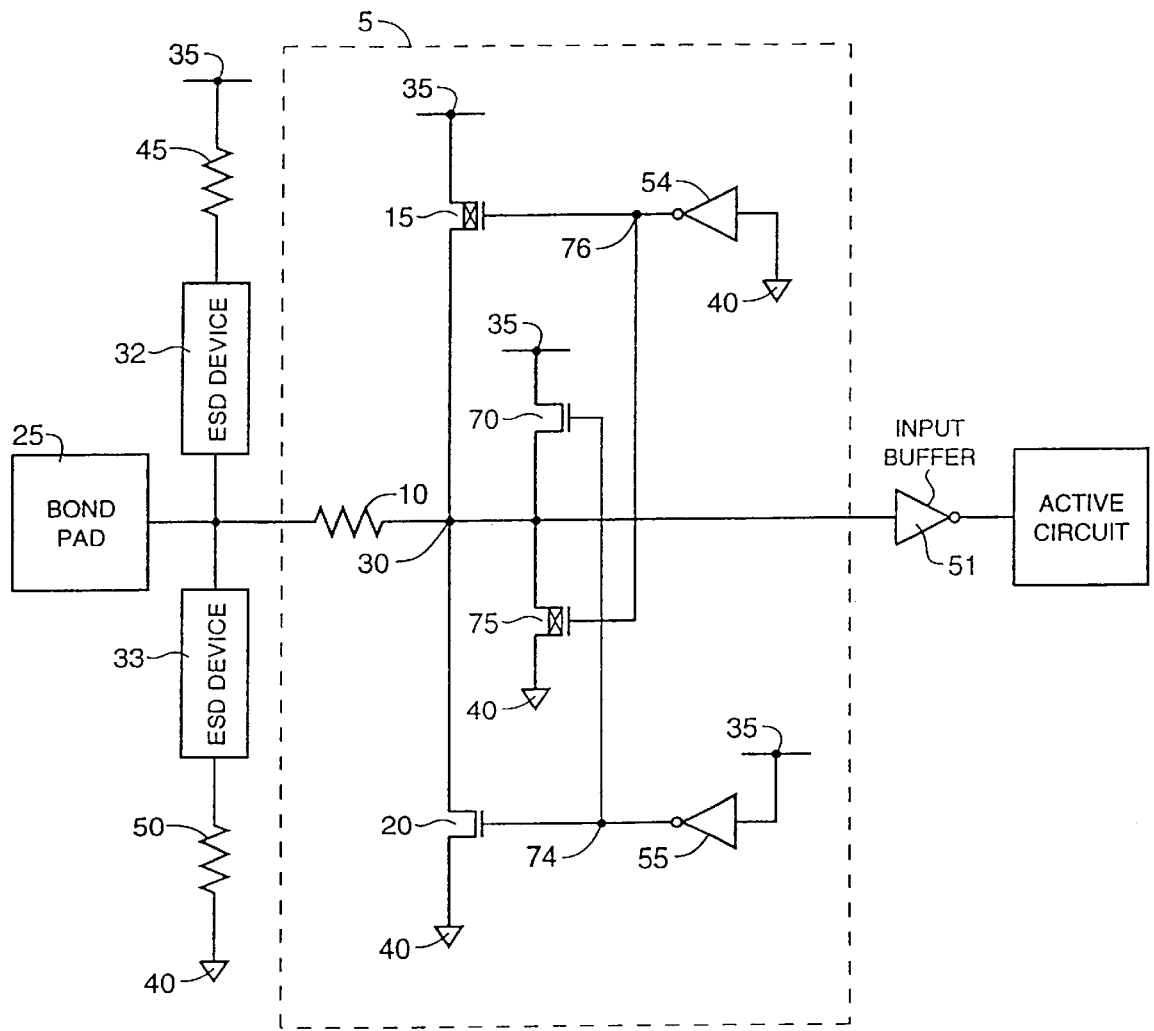
FIGS. 3A–B are schematics of a second implementation of the first embodiment
Figure 3B:
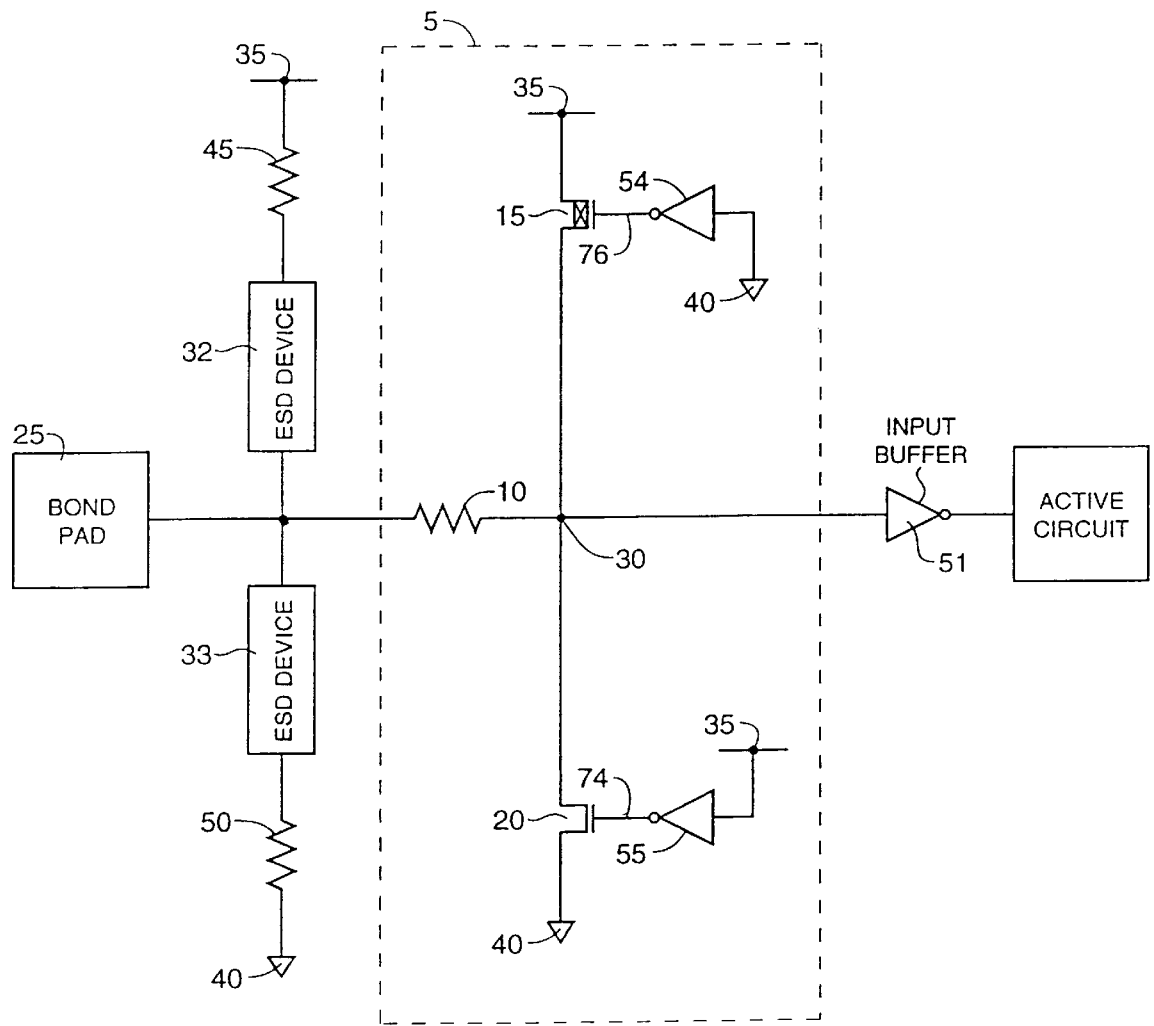

A second implementation of the integrated circuit of the first embodiment is shown in FIGS. 3A–B. Corresponding components are numbered the same in FIGS. 2 and 3A–B. In FIG. 3A p-channel MOS transistor 15 and n-channel MOS transistor 70 are interposed between input node 30 and supply node 35, and n-channel MOS transistor 20 and p-channel MOS transistor 75 are interposed between input node 30 and reference node 40. The gates of transistors 70 and 20 are connected to node 74 of invertor 55 which is connected to supply node 35, and the gates of transistors 15 and 75 are connected to the node 76 of invertor 54 which is connected to reference node 40. In the case where an even number of serially connected invertors are used to connect the gates the serially connected inverters are connected to the opposite supply nodes of those shown in FIGS. 3A–B. FIGS. 3 A–B show the supply and reference node connections for an odd number of serially connected invertors. In either case, when the supply and reference potentials are not applied to supply node 35 and reference node 40, respectively, the potentials of gates at nodes 74 and 76 are floating at opposite potentials since invertors 55 and 54 are designed to be identical. Thus one set of transistors, 15 and 75 or 20 and 70, actuates when one of the ESD devices 32 or 33 drives a potential to the bond pad during an ESD event The actuation of one pair of transistors provides a current path allowing resistor 10 to conduct current. A voltage drop occurs across the input resistor 10 thereby reducing the input potential seen by the input buffer 51. Thus the in put buffer 51 is protected from ESD potentials greater than the buffer breakdown potential; and active transistors 15, 20, 70 and 75, resistor 10, and invertors 54 and 55 function as voltage protection circuit 5.

During normal operation of the circuit the reference node 40 is connected to a reference potential and the supply node 35 is connected to a supply potential, thereby deactuating all of the transistors 15, 20, 70 and 75. During handling nodes 35 and 40 are not connected to supply and reference potentials.

The circuit of FIG. 3B is similar to that of FIG. 3A with the omission of transistors 70 and 75. As was the case in FIGS. 3A the potentials of the gates at nodes 74 and 76 are driven by matched investors 55 and 54, respectively. Therefore, when the supply and reference potentials are not applied to supply node 35 and reference node 40, respectively, the potentials of the gates at nodes 74 and 76 float. At least one of the ESD circuits 32 or 33 generates a potential at the bond pad 25 during an ESD event. In response to the bond pad potential, one of the pass transistors 15 or 20 actuates and current flows through resistor 10. A voltage drop occurs across resistor 10 thereby reducing the potential seen by the input buffer 51. Thus, the input buffer 51 is protected from ESD potentials greater than the buffer breakdown potential; and active transistors 15 and 20, resistor 10, and invertors 54 and 55 function as a voltage protection circuit 5.

During normal operation of the integrated circuit, the reference node 40 is connected to a reference potential and the supply node 35 is connected to a supply potential, thereby deactuating transistors 70 and 75 of FIG. 3A. As is the case in the first embodiment, during handling nodes 35 and 40 are not connected to supply and reference potentials.

Figure 4A:
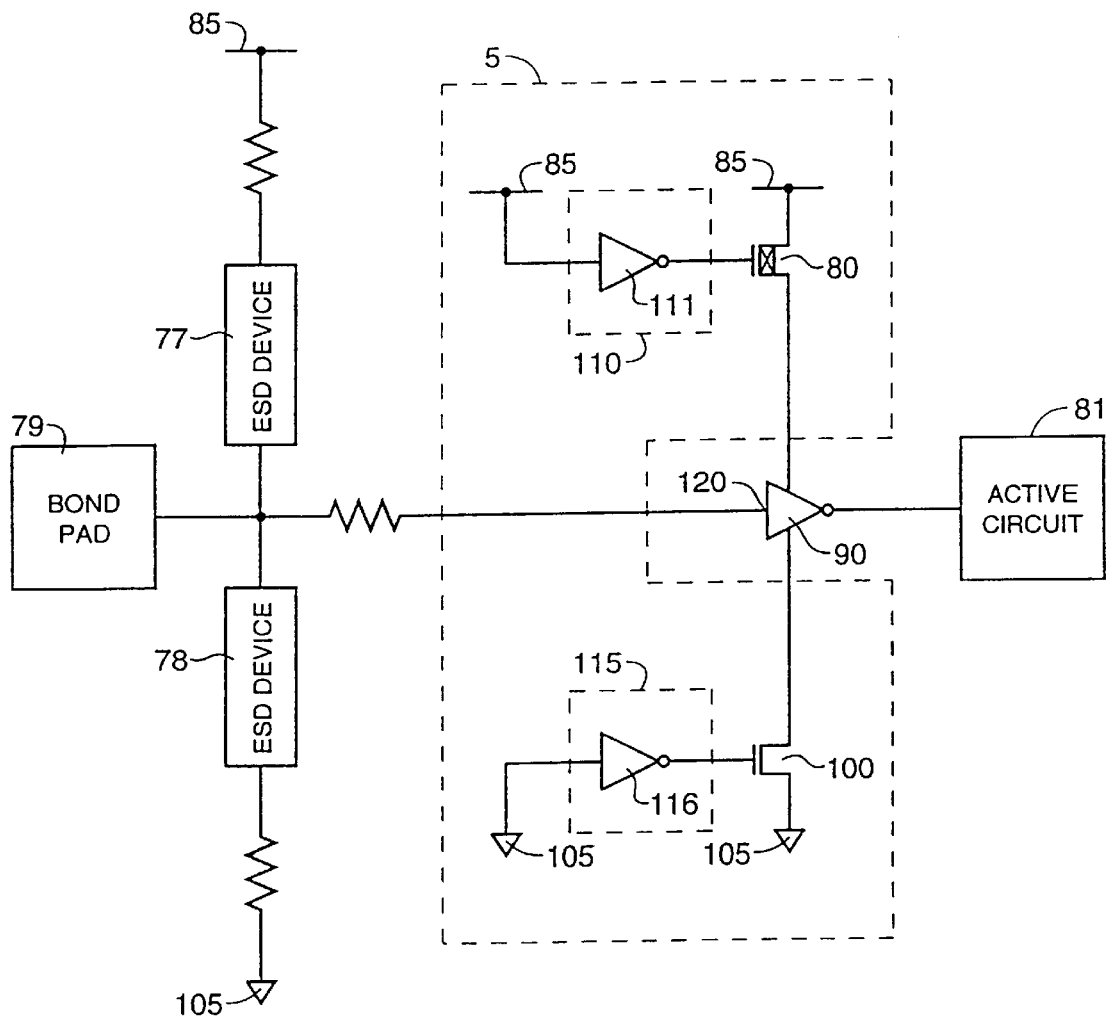
FIGS. 4A–C are schematics of a second exemplary embodiment of the invention.
Figure 4B:
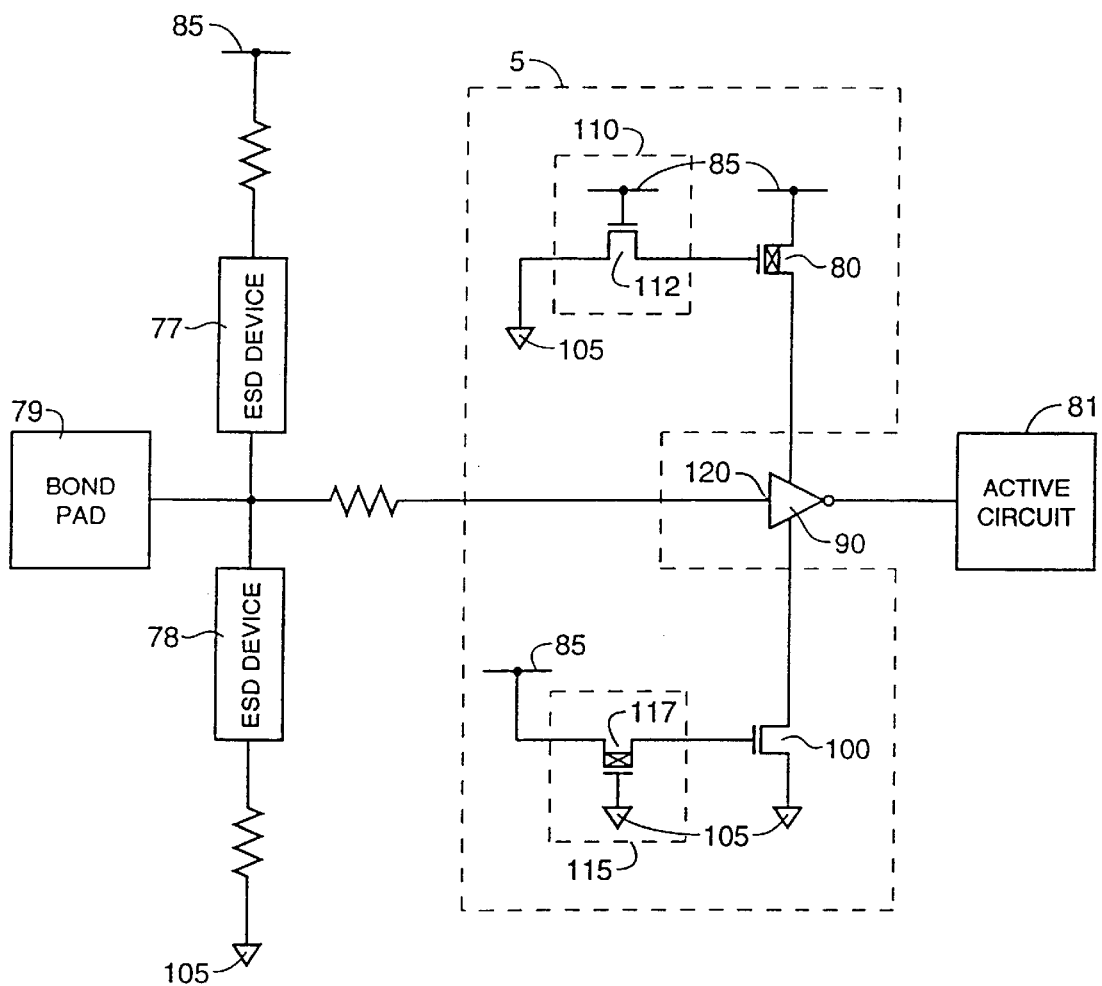
Figure 4C:
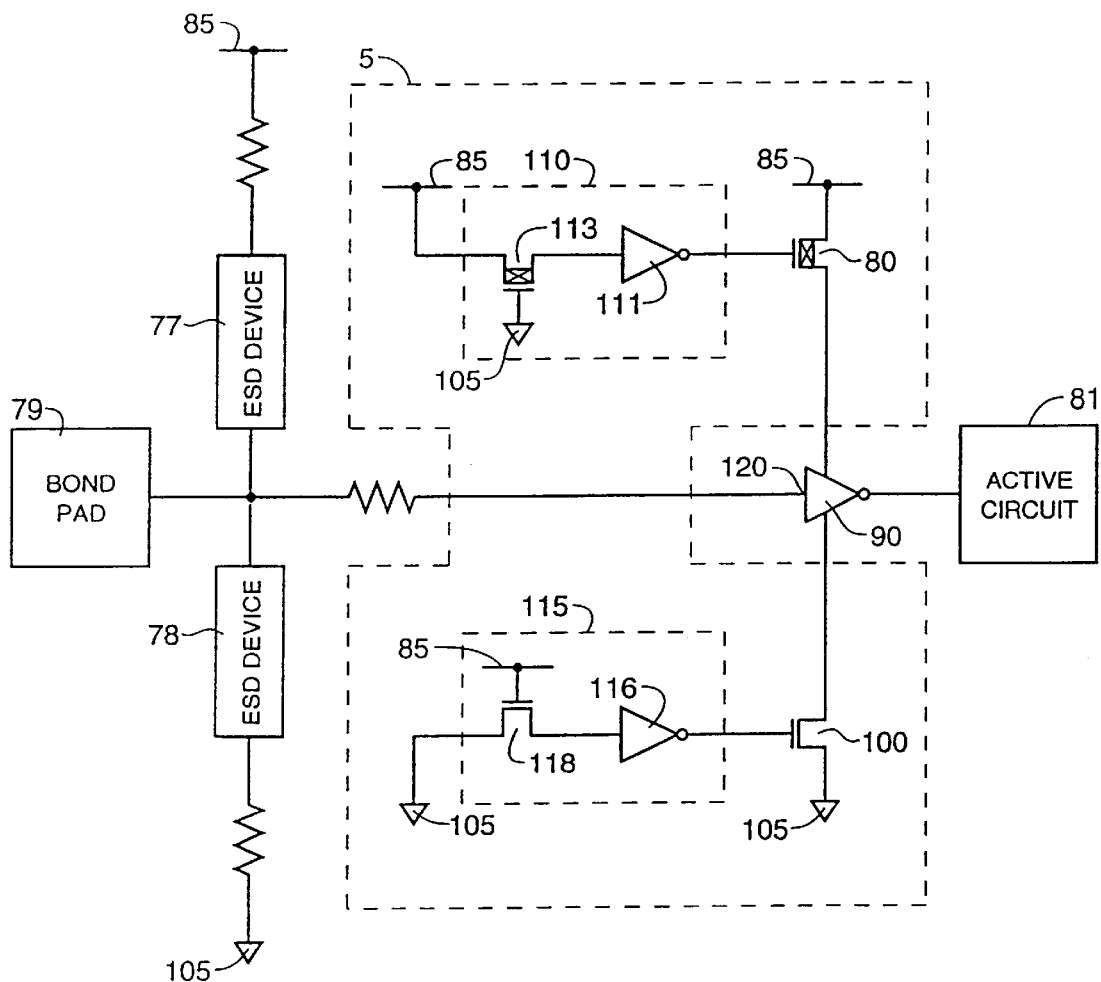

In a futher currently envisioned exemplary embodiment, shown in FIGS. 4A–C, the invention provides an integrated circuit having a voltage protection circuit in electrical communication with an input buffer. Corresponding elements are numbered the same in FIGS. 4A–C. The voltage protection circuit 5 of the invention limits a potential seen at an input buffer input node to a value less than a value provided by an electrostatic discharge (ESD) circuit The input buffer 90 is interposed between a bond pad 79 and internal active circuitry 81 of the integrated circuit At ieast one of the ESD circuits 77 or 78 generates a reduced ESD potential at the bond pad 79 during an ESD event. A MOS p-channel first isolation transistor 80 is interposed between a supply node 85 and the input buffer 90, and a MOS n-channel second isolation transistor 100 is interposed between a reference node 105 and the input buffer 90. Control circuit 110 is interposed between supply node 85 and the gate of transistor 80, and control circuit 115 is interposed between reference node 105 and the gate of transistor 100.

In FIG. 4A the control circuit 110 is an invertor 111 interposed between the gate of isolation transistor 80 and supply node 85, and the control circuit 115 is an invertor 116 interposed between the gate of isolation transistor 100 and reference node 105.

In FIG. 4B the control circuit 110 is an n-channel MOS transistor 112 interposed between reference node 105 and the gate of isolation transistor 80, and control circuit 115 is a p-channel MOS transistor 117 interposed between the gate of isolation transistor 100 and supply node 85. The gate of transistor 112 is connected to supply node 85, and the gate of transistor 117 is connected to reference node 105.

In FIG. 4C control circuit 110 is the same as that shown in FIG. 4A except for the addition of a p-channel MOS transistor 113 interposed between the supply node 85 and invertor 111, and control circuit 115 is the same as that shown in FIG. 4A except for the addition of an n-channel MOS transistor 118 interposed between invertor 116 and reference node 105. The gate of transistor 113 is connected to reference node 105, and the gate of transistor 118 is connected to supply node 85. Referring to FIGS. 4A–C, when there is no external power applied to supply node 85 and reference node 105, the isolation transistors 80 and 100 are deactuated isolating the input buffer 90 from the supply node 85 and the reference node 105. When the input buffer 90 is isolated from supply node 85 and reference node 105, the bond pad potential is divided between the gate oxide of internal transistors of the input buffer 90 and the isolation transistors 80 and 100. Thus the input buffer 90 is protected during the ESD event since its internal transistors do not see the entire bond pad potential generated by ESD devices 77 and 78. The potential they do see is less than their breakdown voltage. In this embodiment the isolation transistors 80 and 100 and the control circuits 110 and 115 function as the voltage protection circuits of the invention.

Figure 5:
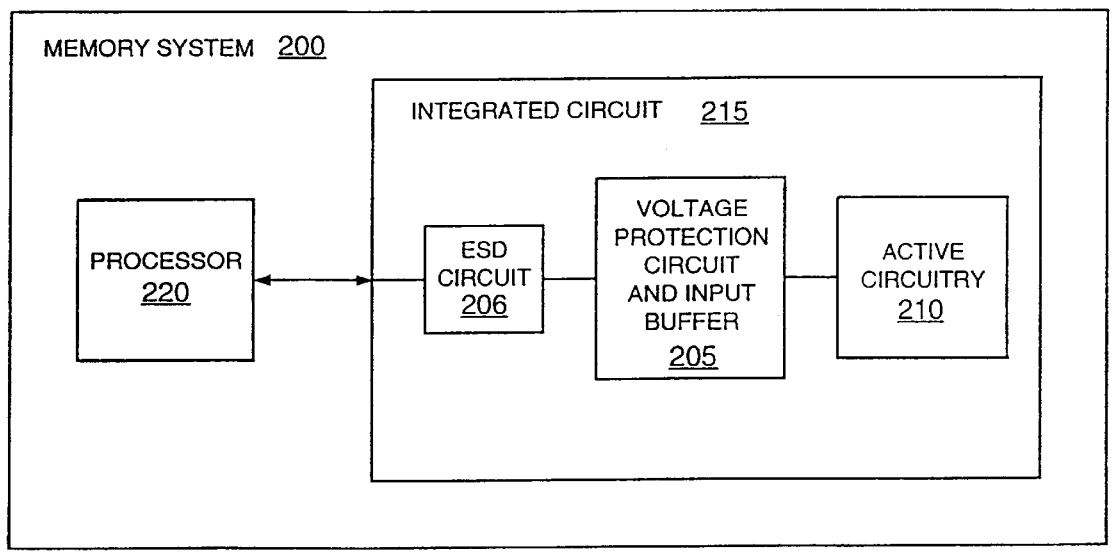
FIG. 5 is a block schematic of a memory system of the invention.

During normal circuit operation, supply nodes 85 is connected to Vcc, and reference node 105 is connected to ground. When powered transistors 80 and 100 actuate coupling the input buffer 90 to Vcc and ground Referring to FIG. 5, the invention also provides a memory system 200 comprising the voltage protection circuit and input buffer 205 of the invention. The voltage protection circuit and input buffer 205, ESD circuit 206, and active circuitry 210 form an integrated circuit 215. The voltage protection circuit and input buffer 205 protect the active circuitry 210 during-an ESD event The integrated circuit 215 and a processor 220 form at least part of the memory system 200. The processor 220 is used to generate control signals which drive the integrated circuit 215 during normal circuit operation.

It is to be understood that although the present invention has been described with reference to preferred embodiments, various modifications to these with reference to preferred embodiments, various modifications to these embodiments may be made without departing from the invention as recited in the claims appended hereto. P-channel devices may be substituted for n-channel devices and vice versa In this case Vcc and the reference potential would also be switched.

What is claimed is:

1. An integrated circuit, comprising:
   a pad;
   a buffer circuit in electrical communication with the pad;
   at least one electrostatic discharge (ESD) circuit configured to control a pad potential in response to an electrostatic discharge (ESD) event; and
   an active voltage protection circuit in electrical communication with the pad, the buffer circuit and the at least one ESD circuit, wherein the active voltage protection circuit protects the buffer circuit and is actuated by the ESD circuit in response to the ESD event.

2. The integrated circuit of claim 1, wherein the ESD circuit provides a voltage for actuating the active voltage protection circuit by drawing a current through a passive device in response to the ESD event.

3. The integrated circuit of claim 1, wherein the active voltage protection circuit includes at least one active element configured to provide a current path that limits a buffer circuit input potential by providing a voltage drop between the ESD circuit and the buffer circuit.

4. The integrated circuit of claim 1, wherein the active voltage protection circuit includes:
   an input resistor through which the ESD circuit and the pad are electrically connected to the buffer circuit; and
   at least one active element configured to provide a current path through the input resistor that limits a buffer circuit input potential.

5. The integrated circuit of claim 1, wherein two ESD circuits control the pad potential in response to the ESD event;
   wherein the active voltage protection circuit includes:
      an input resistor through which the ESD circuit and the pad are electrically connected to the buffer circuit; and
      two active elements configured to limit a buffer circuit input potential;
   wherein a current path is provided through the input resistor and one of the active elements in response to the ESD event; and
   wherein the current path through the resistor limits the buffer circuit input potential.

6. An integrated circuit, comprising:
   a pad;
   a buffer circuit in electrical communication with the pad;
   at least one electrostatic discharge (ESD) circuit configured to control a pad potential in response to an electrostatic discharge (ESD) event; and
   an active voltage protection circuit in electrical communication with the pad, the buffer circuit and the at least one ESD circuit, wherein the active voltage protection circuit is actuated by the ESD circuit in response to the ESD event, wherein the ESD circuit draws a current through a passive device in response to the ESD event to actuate the voltage protection circuit.

7. The integrated circuit of claim 6, wherein the active voltage protection circuit includes:
   an input resistor through which the pad is electrically connected to the buffer circuit; and
   at least one active element configured to provide a current path through the input resistor that limits a buffer circuit potential by providing a voltage drop between the ESD circuit and the buffer circuit.

8. An integrated circuit, comprising:
   a pad;
   a buffer circuit in electrical communication with the pad;
   at least one electrostatic discharge (ESD) circuit configured to control a pad potential in response to an electrostatic discharge (ESD) event; and
   an active voltage protection circuit in electrical communication with the pad, the buffer circuit and the at least one ESD circuit, wherein the active voltage protection circuit is actuated by the ESD circuit in response to the ESD event, wherein the ESD circuit draws a current through a passive device in response to the ESD event to actuate the active voltage protection circuit, the active voltage protection circuit including:
      an input resistor through which the buffer circuit is in electrical communication with the ESD circuit and the pad; and
      at least one active element configured to provide a current path through the input resistor that limits a buffer circuit input potential.

9. The integrated circuit of claim 8, wherein two ESD circuits control the pad potential in response to the ESD event;

wherein at least one active element includes two active elements configured to limit the buffer circuit input potential;

wherein a current path is provided through the input resistor and one of the active elements in response to the ESD event; and wherein the current path through the input resistor limits the buffer circuit input potential by providing a voltage drop between the ESD circuit and the buffer circuit.

10. An integrated circuit, comprising:

a pad;

a buffer circuit in electrical communication with the pad;

at least one electrostatic discharge (ESD) circuit configured to control a pad potential in response to an electrostatic discharge (ESD) event; and an active voltage protection circuit in electrical communication with the pad and the buffer circuit, wherein the voltage protection circuit includes:

at least one control circuit; and at least one isolation transistor actuated by the at least one control circuit to isolate the buffer circuit.

11. The integrated circuit of claim 10, wherein the at least one control circuit includes an inverter, wherein an input of the inverter is in electrical communication with a supply, and wherein an output of the inverter is in electrical communication with a gate of the at least one isolation transistor.

12. The integrated circuit of claim 10, wherein the at least one control circuit includes a first control circuit and a second control circuit;

wherein the at least one isolation transistor includes a first isolation transistor and a second isolation transistor;

wherein the first control circuit and the first isolation transistor cooperate to isolate the buffer circuit from a first supply node when the first supply node is floating; and wherein the second control circuit and the second isolation transistor cooperate to isolate the buffer circuit from a second supply node when the second supply node is floating.

13. The integrated circuit of claim 10, wherein the at least one control circuit includes a control transistor configured to provide electrical communication between a first supply node and a gate of the at least one isolation transistor, and wherein a gate of the control transistor is in electrical communication with a second supply node.

14. The integrated circuit of claim 10, wherein the at least one control circuit includes an inverter and a control transistor;

wherein an output of the inverter is in electrical communication with a gate of the at least one isolation transistor;

wherein the control transistor is configured to provide electrical communication between a first supply node and an input of the inverter; and wherein a gate of the control transistor is in electrical communication with a second supply node.

15. An integrated circuit, comprising:

a pad;

a buffer circuit in electrical communication with the pad;

at least one electrostatic discharge (ESD) circuit configured to control a pad potential in response to an electrostatic discharge (ESD) event; and an active voltage protection circuit in electrical communication with the pad and the buffer circuit, wherein the voltage protection circuit includes:

a first control circuit;

a second control circuit;

a first isolation transistor configured for isolating the buffer circuit from a first supply node when actuated by the first control circuit; and a second isolation transistor configured for isolating the buffer circuit from a second supply node when actuated by the second control circuit.

16. A memory system, comprising:

a processor in electrical communication with a pad;

a memory device, including:

a buffer circuit in electrical communication with the pad;

active circuitry in electrical communication with the buffer circuit;

at least one electrostatic discharge (ESD) circuit configured to control a pad potential in response to an electrostatic discharge (ESD) event; and an active voltage protection circuit in electrical communication with the pad, the buffer circuit and the at least one ESD circuit, wherein the active voltage protection circuit protects the buffer circuit and is actuated by the ESD circuit in response to the ESD event.

17. The memory system of claim 16, wherein the ESD circuit provides a voltage for actuating the active voltage protection circuit by drawing a current through a passive device in response to the ESD event.

18. The memory system of claim 16, wherein the active voltage protection circuit includes at least one active element configured to provide a current path that limits a buffer circuit input potential by providing a voltage drop between the ESD circuit and the buffer circuit.

19. The memory system of claim 16, wherein the active voltage protection circuit includes:

an input resistor through which the ESD circuit and the pad are electrically connected to the buffer circuit; and at least one active element configured to provide a current path through the input resistor that limits a buffer circuit input potential.

20. The memory system of claim 16, wherein two ESD circuits control the pad potential in response to the ESD event;

wherein the active voltage protection circuit includes:

an input resistor through which the ESD circuit and the pad are electrically connected to the buffer circuit; and two active elements configured to limit a buffer circuit input potential;

wherein a current path is provided through the input resistor and one of the active elements in response to the ESD event; and wherein the current path through the resistor limits the buffer circuit input potential.

21. A memory system, comprising:

a processor in electrical communication with a pad;

a memory device, including:

a buffer circuit in electrical communication with the pad;

active circuitry in electrical communication with the buffer circuit;

at least one electrostatic discharge (ESD) circuit configured to control a pad potential in response to an electrostatic discharge (ESD) event; and an active voltage protection circuit in electrical communication with the pad, the buffer circuit and the at least one ESD circuit, wherein the active voltage protection circuit is actuated by the ESD circuit in response to the ESD event to protect the buffer circuit, wherein the ESD circuit draws a current through a passive device to provide a voltage in response to the ESD event to actuate the active voltage protection circuit.

22. The memory system of claim 21, wherein the active voltage protection circuit includes:

an input resistor through which the pad is electrically connected to the buffer circuit; and at least one active element configured to provide a current path through the input resistor that limits a buffer circuit potential by providing a voltage drop between the ESD circuit and the buffer circuit.

23. A memory system, comprising:
a processor in electrical communication with a pad;
a memory device, including:
  a buffer circuit in electrical communication with the pad;
  active circuitry in electrical communication with the buffer circuit;
  at least one electrostatic discharge (ESD) circuit configured to control a pad potential in response to an electrostatic discharge (ESD) event; and
  an active voltage protection circuit in electrical communication with the pad, the buffer circuit and the at least one ESD circuit, wherein the voltage protection circuit is actuated by the ESD circuit in response to the ESD event, wherein the ESD circuit draws a current through a passive device in response to the ESD event to actuate the voltage protection circuit, the active voltage protection circuit including:
    an input resistor through which the buffer circuit is in electrical communication with the ESD circuit and the pad; and
    at least one active element configured to provide a current path through the input resistor that limits a buffer circuit input potential.

24. The memory system of claim 23, wherein two ESD circuits control the pad potential in response to the ESD event;
  wherein at least one active element includes two active elements configured to limit the input potential at the buffer circuit;
  wherein a current path is provided through the input resistor and one of the active elements in response to the ESD event; and
  wherein the current path through the input resistor limits the buffer circuit input potential by providing a voltage drop between the ESD circuit and the buffer circuit.

25. A memory system, comprising:
a processor in electrical communication with a pad;
a memory device, including:
  a buffer circuit in electrical communication with the pad;
  active circuitry in electrical communication with the buffer circuit;
  at least one electrostatic discharge (ESD) circuit configured to control a pad potential in response to an electrostatic discharge (ESD) event; and
  an active voltage protection circuit in electrical communication with the pad and the buffer circuit, wherein the voltage protection circuit includes:
    at least one control circuit; and
    at least one isolation transistor actuated by the at least one control circuit to isolate the buffer circuit.

26. The integrated circuit of claim 25, wherein the at least one control circuit includes an inverter, wherein an input of the inverter is in electrical communication with a supply, and wherein an output of the inverter is in electrical communication with a gate of the at least one isolation transistor.

27. The integrated circuit of claim 25, wherein the at least one control circuit includes a first control circuit and a second control circuit;
  wherein the at least one isolation transistor includes a first isolation transistor and a second isolation transistor;
  wherein the first control circuit and the first isolation transistor cooperate to isolate the buffer circuit from a first supply node when the first supply node is floating; and
  wherein the second control circuit and the second isolation transistor cooperate to isolate the buffer circuit from a second supply node when the second supply node is floating.

28. The integrated circuit of claim 25, wherein the at least one control circuit includes a control transistor configured to provide electrical communication between a first supply node and a gate of the at least one isolation transistor, and wherein a gate of the control transistor is in electrical communication with a second supply node.

29. The integrated circuit of claim 25, wherein the at least one control circuit includes an inverter and a control transistor;
  wherein an output of the inverter is in electrical communication with a gate of the at least one isolation transistor;
  wherein the control transistor is configured to provide electrical communication between a first supply node and an input of the inverter; and
  wherein a gate of the control transistor is in electrical communication with a second supply node.

30. A memory system, comprising:
a processor in electrical communication with a pad;
a memory device, including:
  a buffer circuit in electrical communication with the pad;
  active circuitry in electrical communication with the buffer circuit;
  at least one electrostatic discharge (ESD) circuit configured to control a pad potential in response to an electrostatic discharge (ESD) event; and
  an active voltage protection circuit in electrical communication with the pad and the buffer circuit, wherein the voltage protection circuit includes:
    a first control circuit;
    a second control circuit;
    a first isolation transistor configured for isolating the buffer circuit from a first supply node when actuated by the first control circuit; and
    a second isolation transistor configured for isolating the buffer circuit from
    a second supply node when actuated by the second control circuit.

31. A method for protecting a circuit from electrostatic discharge, comprising:
  conducting current in at least one electrostatic discharge (ESD) circuit to produce at least one control voltage in response to an electrostatic discharge (ESD) event;

providing the at least one control voltage to a control input of at least one active element, wherein the at least one control voltage actuates the at least one active element in response to the ESD event;

providing an input resistor between a pad and an input of a buffer circuit; and providing a current path through the at least one active element and the input resistor in response to the ESD event, wherein the current flowing through the resistor limits a buffer circuit input potential.

32. The method of claim 31, wherein conducting current in at least one ESD circuit to produce at least one control voltage in response to an ESD event comprises providing two ESD circuits to control a pad potential in response to the ESD event;

wherein the at least one active element is two active elements; and wherein providing the at least one control voltage comprises providing one control voltage from each of the two ESD circuits to a control input of a corresponding one of the two active elements.

33. A method for protecting a circuit from electrostatic discharge, comprising:

providing at least one isolation transistor between a buffer circuit and at least one supply node; and in response to an electrostatic discharge (ESD) event,
controlling a pad potential using at least one electrostatic discharge (ESD) circuit, wherein the ESD circuit conducts current; and
actuating the at least one isolation transistor to isolate the buffer circuit from the at least one supply node.

34. The method of claim 33, wherein actuating the at least one isolation transistor includes providing control circuitry configured to receive an input from the at least one supply node and to provide an output to a gate of the at least one isolation transistor.

* * * * *

UNITED STATES PATENT AND TRADEMARK OFFICE
CERTIFICATE OF CORRECTION

PATENT NO. : 6,353,521 B1
DATED : March 5, 2002
INVENTOR(S) : Gans et al.

It is certified that error appears in the above-identified patent and that said Letters Patent is hereby corrected as shown below:

Title page,
Item [57], ABSTRACT,
Line 4, after "buffer" insert -- are disclosed --.

Column 1,
Lines 22, 42 and 67, after "circuit" insert -- . --.
Line 32, after "event" insert -- . --.

Column 2,
Line 12, after "generation of" delete ".".
Line 26, after "circuit" insert -- . --.
Line 35, after "embodiment" insert -- . --.
Line 44, delete "trnsistor" and insert -- transistor --, therefor.

Column 3,
Line 6, after "invention" insert -- . --.
Line 11, after "used" insert -- . --.
Lines 31 and 66, after "event" insert -- . --.

Column 4,
Line 45, after "circuit" insert -- . --.
Line 48, delete "ieast" and insert -- least -- therefor.

Column 5,
Line 28, after "ground" insert -- . --.
Line 35, after "event" insert -- . --.

UNITED STATES PATENT AND TRADEMARK OFFICE
CERTIFICATE OF CORRECTION

PATENT NO. : 6,353,521 B1
DATED : March 5, 2002
INVENTOR(S) : Gans et al.

It is certified that error appears in the above-identified patent and that said Letters Patent is hereby corrected as shown below:

Column 48,
Line 48, after "input" insert -- . --.

Signed and Sealed this

Fourth Day of June, 2002

Attest:

JAMES E. ROGAN
Attesting Officer     Director of the United States Patent and Trademark Office